(12) United States Patent
Wu et al.

(10) Patent No.: US 10,535,816 B2
(45) Date of Patent: Jan. 14, 2020

(54) VIA STRUCTURE, MRAM DEVICE USING THE VIA STRUCTURE AND METHOD FOR FABRICATING THE MRAM DEVICE

(71) Applicant: TAIWAN SEMICONDUCTOR MANUFACTURING CO., LTD., Hsinchu (TW)

(72) Inventors: Jung-Tang Wu, Kaohsiung (TW); Szu-Ping Tung, Taipei (TW); Szu-Hua Wu, Zhubei (TW); Shing-Chyang Pan, Hsinchu County (TW); Meng-Yu Wu, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/059,777

(22) Filed: Aug. 9, 2018

(65) Prior Publication Data
US 2019/0157548 A1 May 23, 2019

Related U.S. Application Data

(60) Provisional application No. 62/590,182, filed on Nov. 22, 2017.

(51) Int. Cl.
*H01L 43/12* (2006.01)
*H01L 27/22* (2006.01)
*H01L 43/02* (2006.01)

(52) U.S. Cl.
CPC .......... *H01L 43/12* (2013.01); *H01L 27/228* (2013.01); *H01L 43/02* (2013.01)

(58) Field of Classification Search
CPC ........ H01L 43/12; H01L 43/02; H01L 27/228
USPC .......................................................... 257/427
See application file for complete search history.

(56) References Cited

U.S. PATENT DOCUMENTS

| 2012/0241958 A1* | 9/2012 | Streck ............ C23C 16/303 257/741 |
| 2016/0343660 A1* | 11/2016 | Kim ............... H01L 23/5226 |
| 2019/0165258 A1* | 5/2019 | Peng ................. H01L 43/12 |

* cited by examiner

*Primary Examiner* — Tong-Ho Kim
(74) *Attorney, Agent, or Firm* — Maschoff Brennan

(57) ABSTRACT

A via structure, a MRAM device using the via structure and a method for fabricating the MRAM device are provided. In the method for fabricating the MRAM device, at first, a first dielectric layer is deposited over a transistor. Then, a contact is formed in the first dielectric layer and electrically connected to the transistor. Thereafter, a metal nitride layer is deposited over the first dielectric layer and the contact. Then, an etch stop layer is deposited over the metal nitride layer. Thereafter, a second dielectric layer is deposited over the etch stop layer. Then, a via structure is formed in the second dielectric layer, the etch stop layer, and the metal nitride layer and landing on the contact. Thereafter, a memory stack is formed over the via structure.

20 Claims, 16 Drawing Sheets

VIA STRUCTURE, MRAM DEVICE USING THE VIA STRUCTURE AND METHOD FOR FABRICATING THE MRAM DEVICE

RELATED APPLICATIONS

This application claims priority to U.S. Provisional Application Ser. No. 62/590,182, filed Nov. 22, 2017, which is herein incorporated by reference.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

However, since feature sizes continue to decrease, fabrication processes continue to become more complex. For example, via structures are frequently used for the decreased feature sizes. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
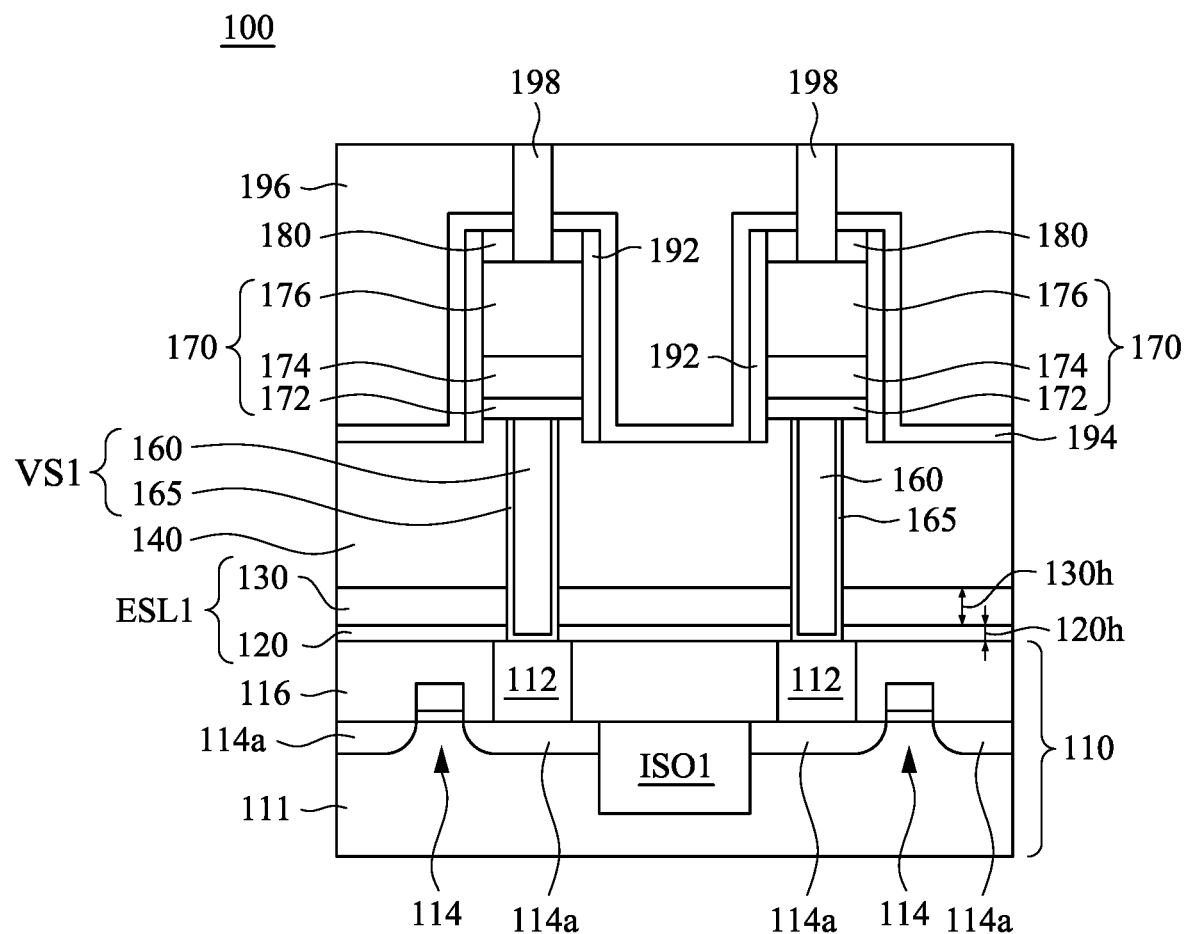
FIG. 1 is a schematic cross-sectional diagram showing via structure in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a via structure, a magnetoresistive random access memory (MRAM) device and a method for fabricating the MRAM device. The MRAM device includes the via structure. In the method for fabricating MRAM device, an etch stop layer is provided to control a first etching operation conducted on a dielectric layer of the via structure. The etch stop layer includes a bottom etch stop layer and a top etch stop layer disposed on the bottom etch stop layer. The bottom etch stop layer is made of a metal-based nitride material, and the top etch stop layer is made of a metal-based oxide material, thereby enabling the etch stop layer to have a smaller thickness. In some embodiments, the thickness of the etch stop layer is smaller than or equal to about 1100 angstrom. Therefore, a time period of an etching operation for removing the etch stop layer is decreased because of the smaller thickness of the etch stop layer, and damages caused on the dielectric layer can be prevented accordingly.

FIG. 1 is a schematic cross-sectional view of a magnetoresistive random access memory (MRAM) device 100 in accordance with some embodiments of the present disclosure. The MRAM device 100 includes semiconductor devices 110, memory stacks 170, and via structures VS1 disposed between the semiconductor devices 110 and the memory stacks 170 to provide electrical connections between the semiconductor devices 110 and the memory stacks 170.

The semiconductor devices 110 each includes a transistor 114. The transistors 114 are disposed on a semiconductor substrate 111. In some embodiments, the semiconductor substrate 111 may include a semiconductor material and may include a graded layer or a buried oxide, for example. In some embodiments, the semiconductor substrate 111 includes bulk silicon that may be undoped or doped (e.g., p-type, n-type, or a combination thereof). Other materials that are suitable for semiconductor device formation may be used. Other materials, such as germanium, quartz, sapphire, and glass, could alternatively be used for the semiconductor substrate 111. Alternatively, the semiconductor substrate 111 may include an active layer of a semiconductor-on-insulator (SOI) substrate or a multi-layered structure, such as a silicon-germanium layer formed on a bulk silicon layer.

An isolation structure ISO1 is disposed in the semiconductor substrate 111 and between the transistors 114 of the semiconductor device 110. A first dielectric layer 116 is disposed over the transistors 114. In some embodiments, the first dielectric layer 116 functions as a planarization layer to provide a flat surface for an etch stop layer ESL1. Contacts 112 are disposed in the dielectric layer 116 and electrically connect the via structures VS1 to source/drain regions 114a of the transistors 114. In some embodiments, the contacts 112 include Co, Cu, W, TiN, Ti, TaN, other suitable materials, or combinations thereof.

The etch stop layer ESL1 is disposed over the first dielectric layer 116, and a second dielectric layer 140 is disposed over the etch stop layer ESL1, thereby controlling a first etching operation conducted on the second dielectric layer 140. In some embodiments, the second dielectric layer 140 may include any suitable dielectric material including silicon oxide, silicon nitride, silicon oxynitride, hafnium oxide, zirconium oxide, titanium oxide, aluminum oxide, hafnium dioxide-alumina ($Hf_O_2$—$Al_2O_3$) alloy, phosphosilicate glass (PSG), borophosphosilicate glass (BPSG), other suitable dielectric materials, and/or combinations thereof. In some embodiments, the second dielectric layer 140 may be formed using a silicon-containing precursor including tetra-ethyl-ortho-silicate (TEOS). The second dielectric layer 140 may include a low-k dielectric material, such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper porous polymeric materials, or combinations thereof.

The via structures VS1 pass through the second dielectric layer 140 and the etch stop layer ESL1. For example, the via structures VS1 each includes a conductor 160 and a diffusion barrier layer 165 wrapping around the conductor 160. The conductor 160 provides electrical connections between the contacts 112 and the memory stacks 170. In some embodiments, the conductor 160 may include Co, Cu, W, TiN, Ti, TaN, other suitable materials, or combinations thereof. In some embodiments, the diffusion barrier layer 165 may include TiN, TaN, Ta, Ti, Co, Ni and/or combination thereof.

The memory stacks 170 are disposed over the second dielectric layer 140. Each of the memory stacks 170 includes a first electrode layer 172, a storage material layer 174, and a second electrode layer 176. The first electrode layer 172 is electrically connected to the corresponding via structures VS1, and the storage material layer 174 is disposed between the first electrode layer 172 and the second electrode layer 176. In some embodiments, the first electrode layer 172 and the second electrode layer 176 may include Ti, Ta, TiN, TaN, or other suitable metals or materials. In some embodiments, the storage material layer 174 may include multiple layers. For example, the storage material layer 174 may include a magnetic tunnel junction (MTJ) cell having a free synthetic antiferromagnetic (SAF) layer, a pinned SAF layer and a tunnel barrier layer interposed between the free SAF layer and the pinned SAF layer. Furthermore, the free SAF layer may include a plurality of ferromagnetic layers and at least one antiferromagnetic coupling spacer layer interposed between two adjacent ones of the ferromagnetic layers. The pinned SAF layer may include a pinned ferromagnetic layer, a fixed ferromagnetic layer and an antiferromagnetic coupling spacer layer interposed between the pinned ferromagnetic layer and the fixed ferromagnetic layer. The materials for the tunnel barrier layer may include electrically insulating materials that form a tunneling junction. Examples of such materials include MgO, AlN, TaN, and/or $Ta_2O_5$. In some embodiments, the MTJ cell includes Co, Fe, B, Ni, Mg, Mo, or Ru, or a combination thereof.

The etch stop layer ESL1 includes a bottom etch stop layer 120 and a top etch stop layer 130. The bottom etch stop layer 120 is disposed over the first dielectric layer 116, and the top etch stop layer 130 is disposed over the bottom etch stop layer 120. The bottom etch stop layer 120 is a metal-based nitride layer and has a thickness 120h. The top etch stop layer 130 is a metal-based oxide layer and has a thickness 130h. In some embodiments, the top etch stop layer 130 and the bottom etch stop layer 120 include the same metal. In some embodiments, the bottom etch stop layer 120 includes aluminum nitride, and the top etch stop layer 130 includes aluminum oxide. In some embodiments, an atom ratio of aluminum to nitride is defined from about 1 to about 3.

In some embodiments, the bottom etch stop layer 120 includes tantalum nitride, and the top etch stop layer 130 includes tantalum oxide. In some embodiments, the bottom etch stop layer 120 includes titanium nitride, and the top etch stop layer 130 includes titanium oxide. However, embodiments of the present disclosure are not limited thereto. In some embodiments, the bottom etch stop layer 120 is capable of preventing oxide diffusion when hydrogen is introduced. For example, hydrogen may be introduced when forming the top etch stop layer 130, and the bottom etch stop layer 120 is capable of preventing oxide diffusion when forming the top etch stop layer 130. In some embodiments, a thickness of the bottom etch stop layer 120 is equal to or smaller than a thickness of the top etch stop layer 130.

The etch stop layer ESL1 is provided to have a small thickness. In some embodiments, the thickness 120h is greater than or equal to about 5 angstrom and smaller than or equal to about 100 angstrom, and a ratio of the thickness 130h to the thickness 120h is from about 10 to about 1. In other words, a thickness of the etch stop layer ESL1 is greater than or equal to about 10 angstrom and smaller than or equal to about 1100 angstrom. Because the etch stop layer ESL1 having the small thickness is provided, a time period of the etching operation for etching the etch stop layer ESL1 is decreased, and damages caused on the second dielectric layer 140 by the etching operation can be reduced.

When the etch stop layer ESL1 is etched to form through holes for the via structures VS1, a top portion of the second dielectric layer 140 may be damaged by the etching operation for etching the etch stop layer ESL1. If the thickness of the etch stop layer ESL1 is greater than about 1100 angstrom, the time period of the etching operation may be too long, and damages on the top portion of the second dielectric layer 140 may result in wider top portions of the through holes. That will be translated into a smaller distance between top portions of the via structures VS1. The smaller distance between the top portions of the via structures VS1 may cause current leakage between the via structures VS1. If the thickness of the etch stop layer ESL1 is smaller than about 10 angstrom, the etching operation for etching the second dielectric layer 140 may not be stopped at the etch stop layer ESL1.

Mask layers 180 are disposed over the memory stacks 170. In some embodiment, the mask layers 180 are hard masks which may include silicon nitride or silicon oxynitride. Spacers 192 are disposed on sidewalls of the memory stacks. In some embodiments, the spacers 192 may include silicon nitride or silicon carbide. A dielectric liner layer 194 is conformally disposed over the mask layers 180, the spacers 192 and the second dielectric layer 140. A third dielectric layer 196 is disposed over the dielectric liner layer 194. Contacts 198 pass through the dielectric layer 196, the dielectric liner layer 194 and the mask layers 180 to be electrically connected to the second electrode layers 176 of the memory stacks 170. In some embodiments, the contacts 198 may include tungsten, tungsten-based alloy, copper, copper-based alloy, other suitable materials, or combinations thereof.

Figure 2A:
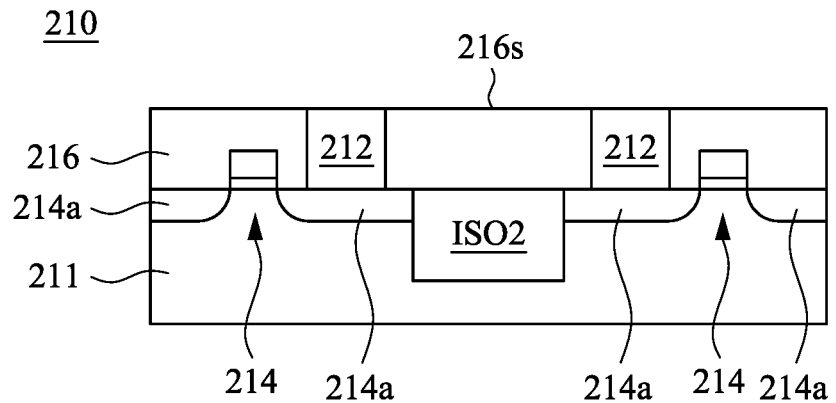
FIG. 2A to FIG. 2P are cross-sectional views of intermediate stages showing a method for fabricating a Magnetoresistive Random Access Memory (MRAM) device in accordance with an embodiment of the present disclosure.
Figure 2B:
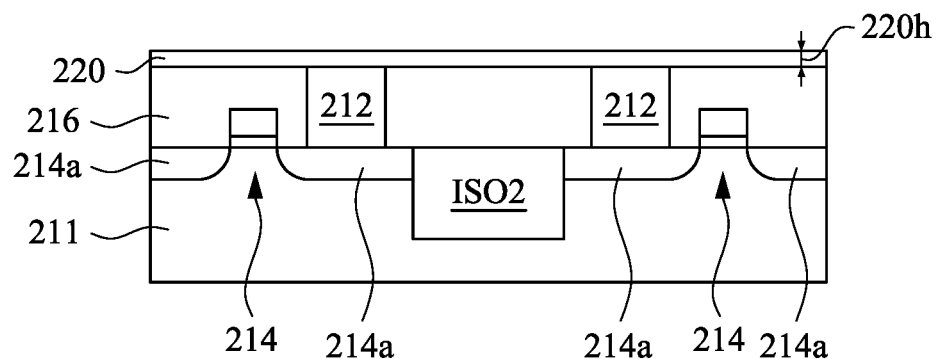
Figure 2C:
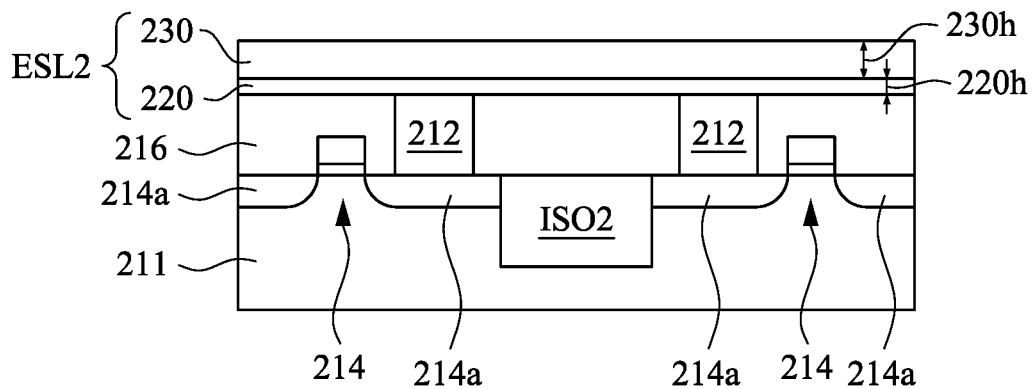
Figure 2D:
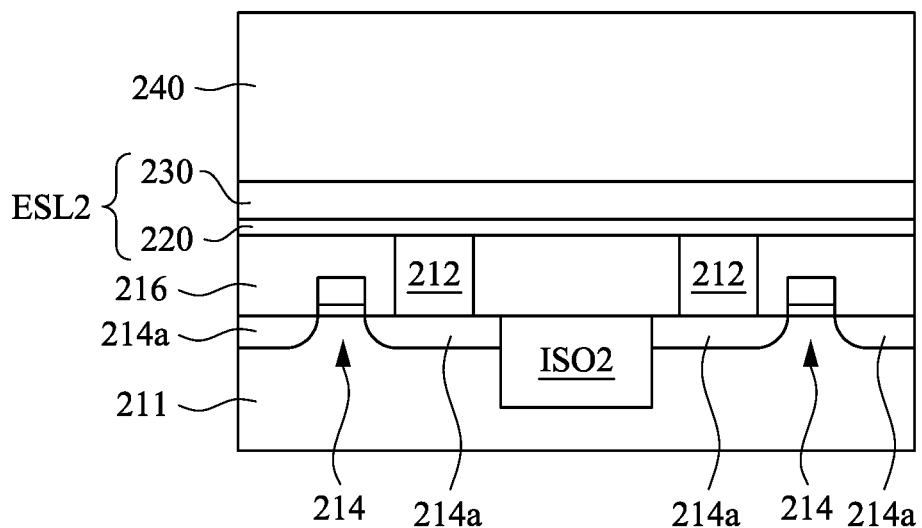
Figure 2E:
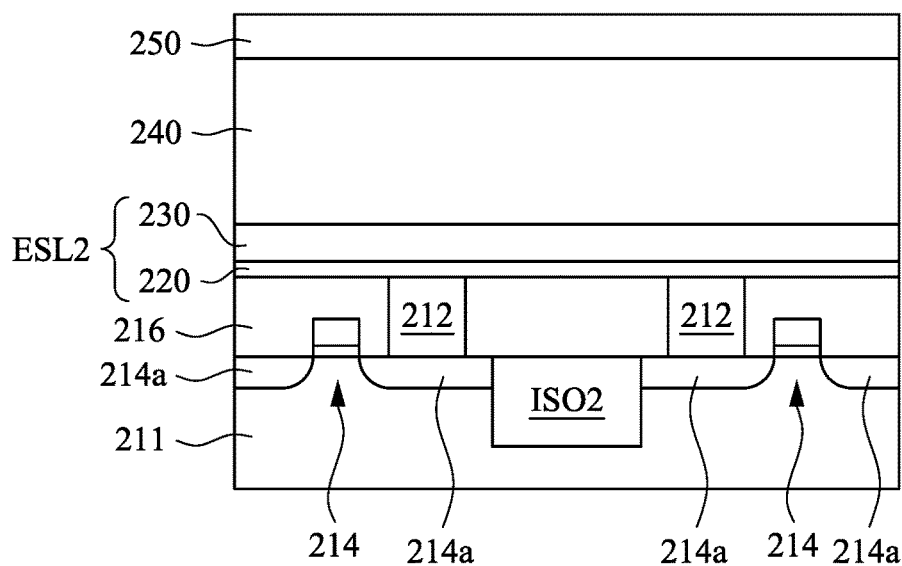
Figure 2F:
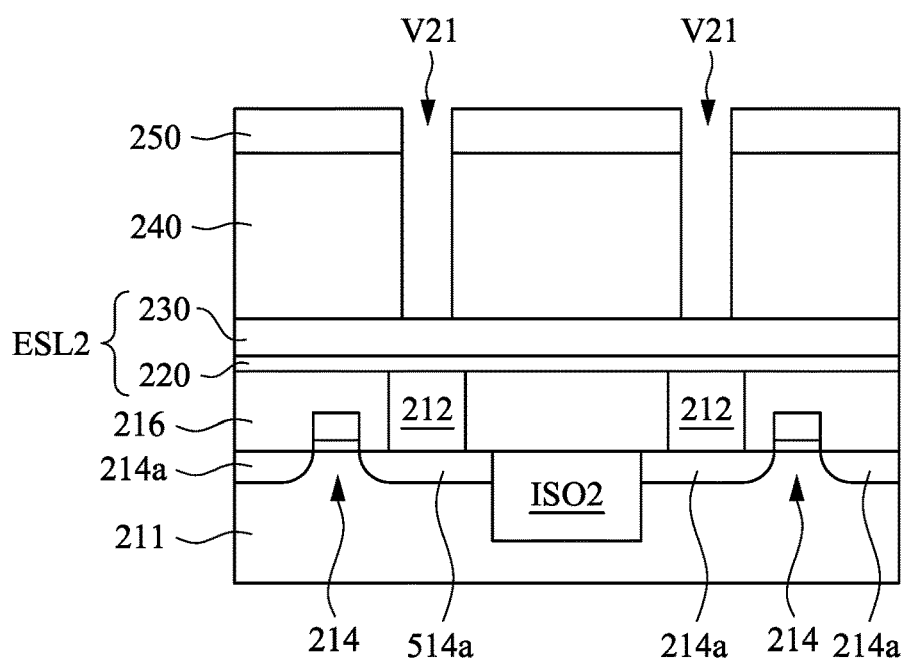
Figure 2G:
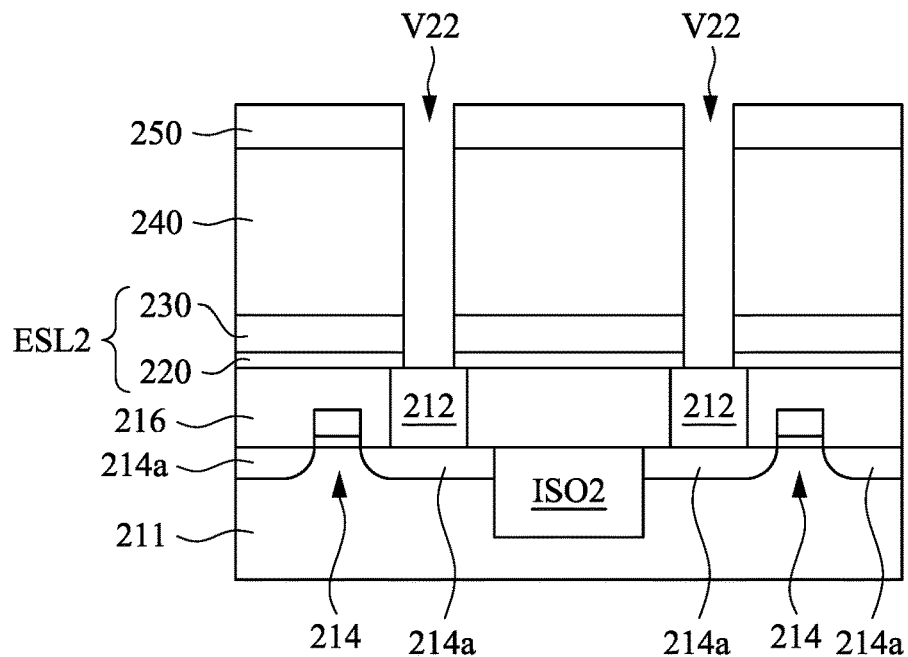
Figure 2H:
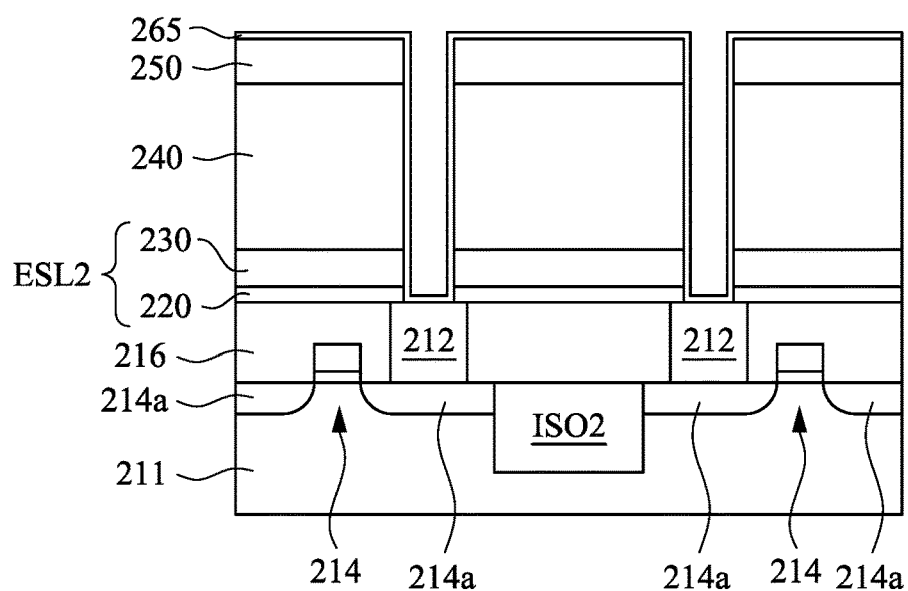
Figure 2I:
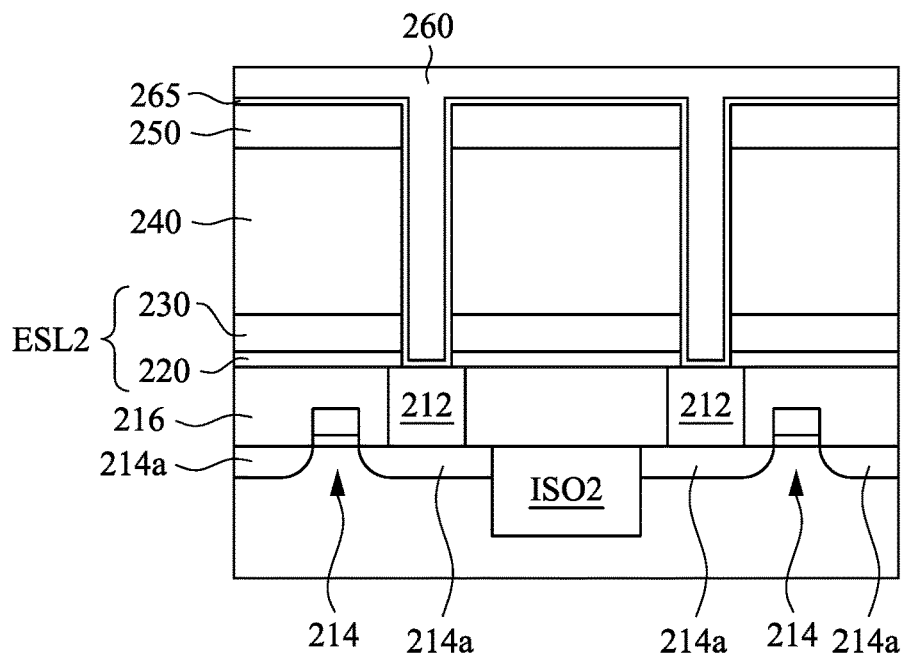
Figure 2J:
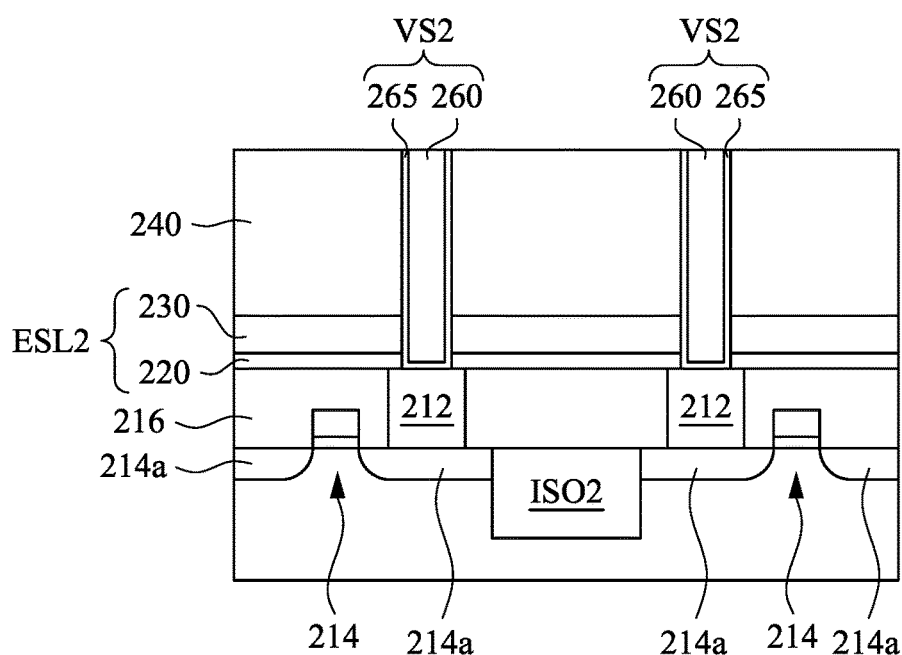
Figure 2K:
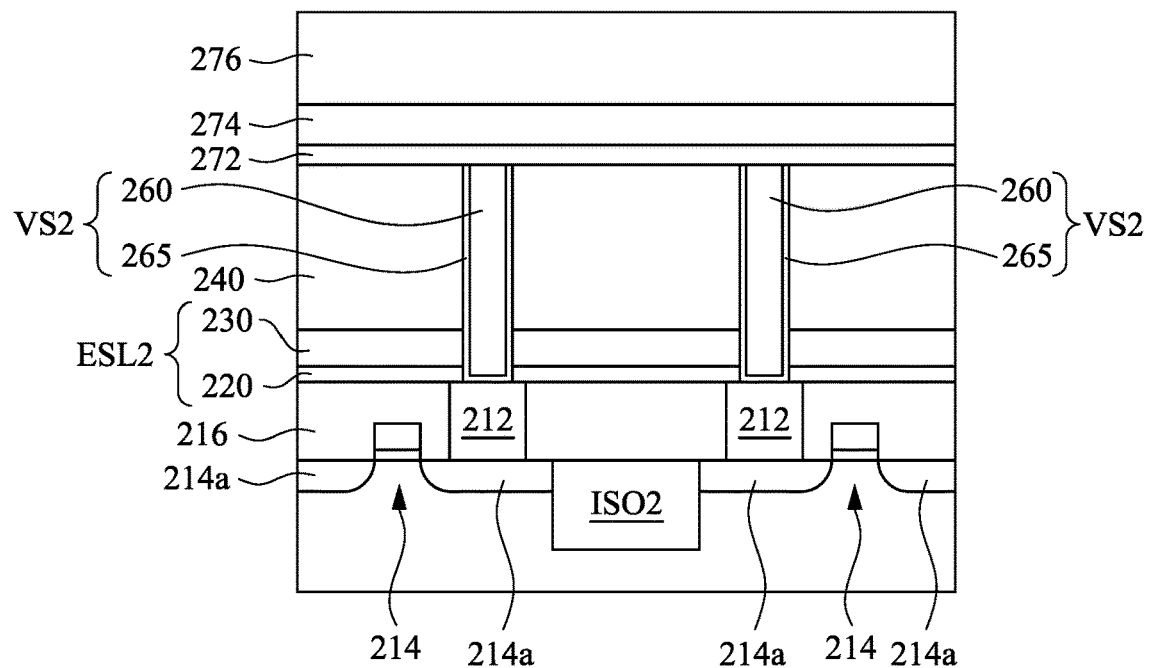
Figure 2L:
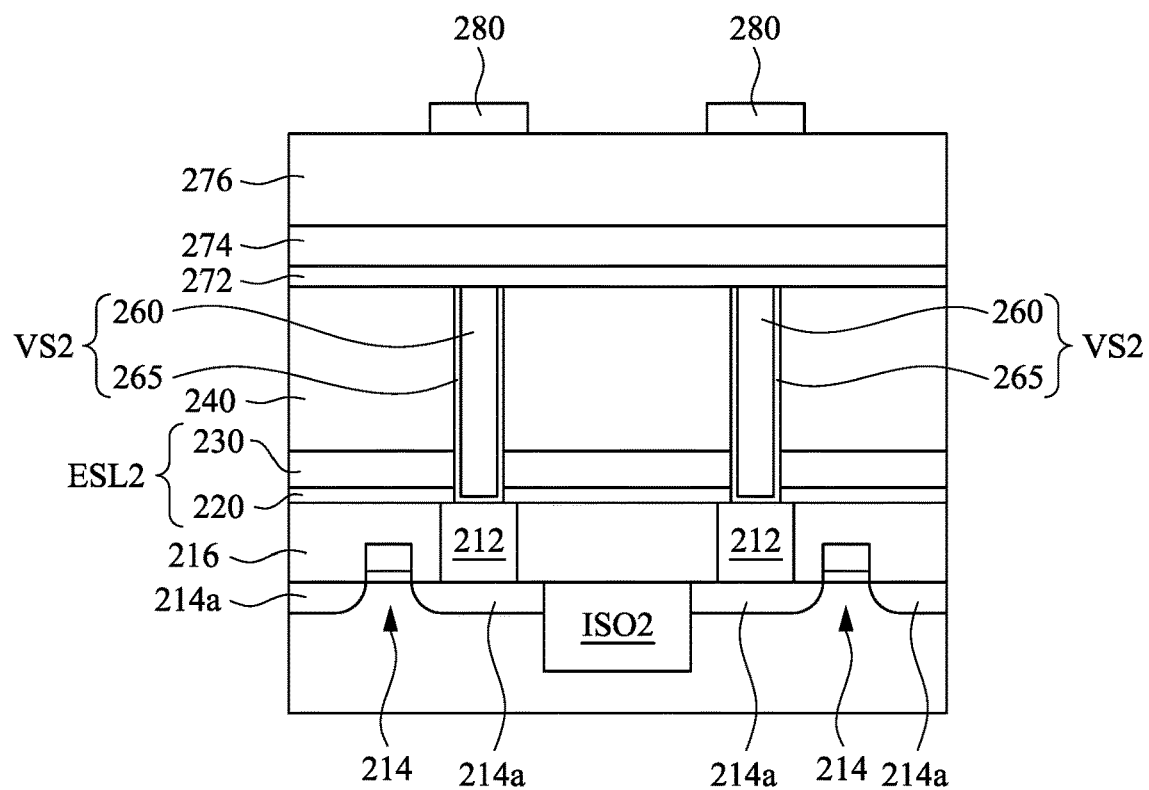
Figure 2M:
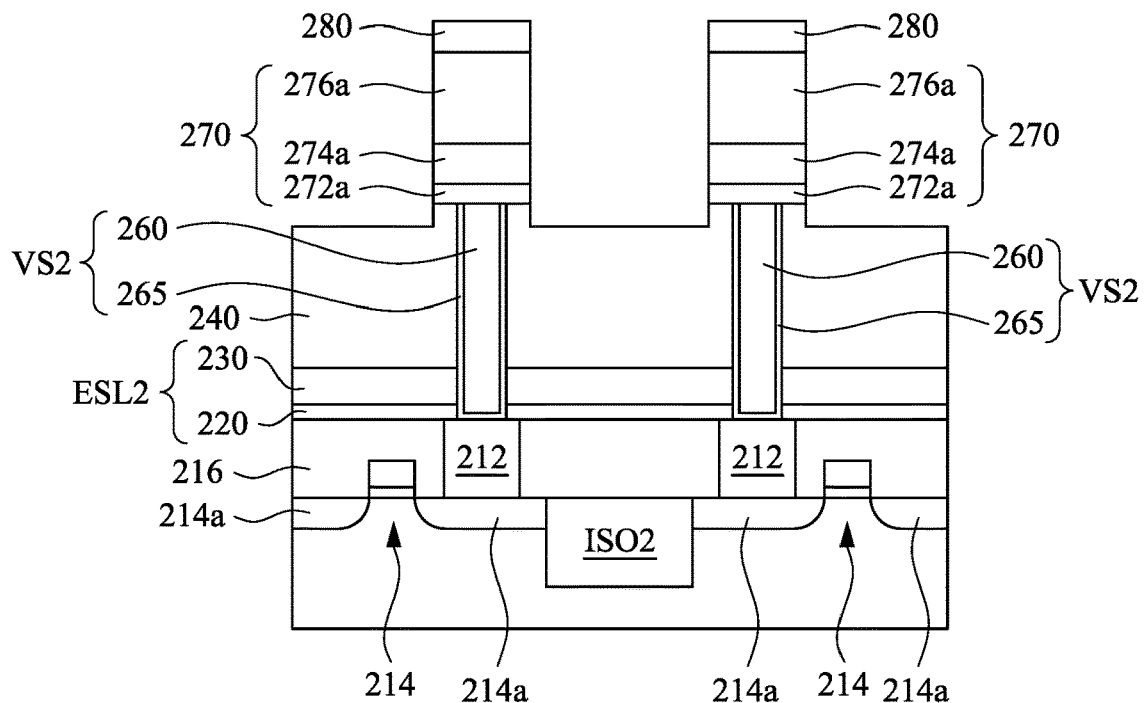
Figure 2N:
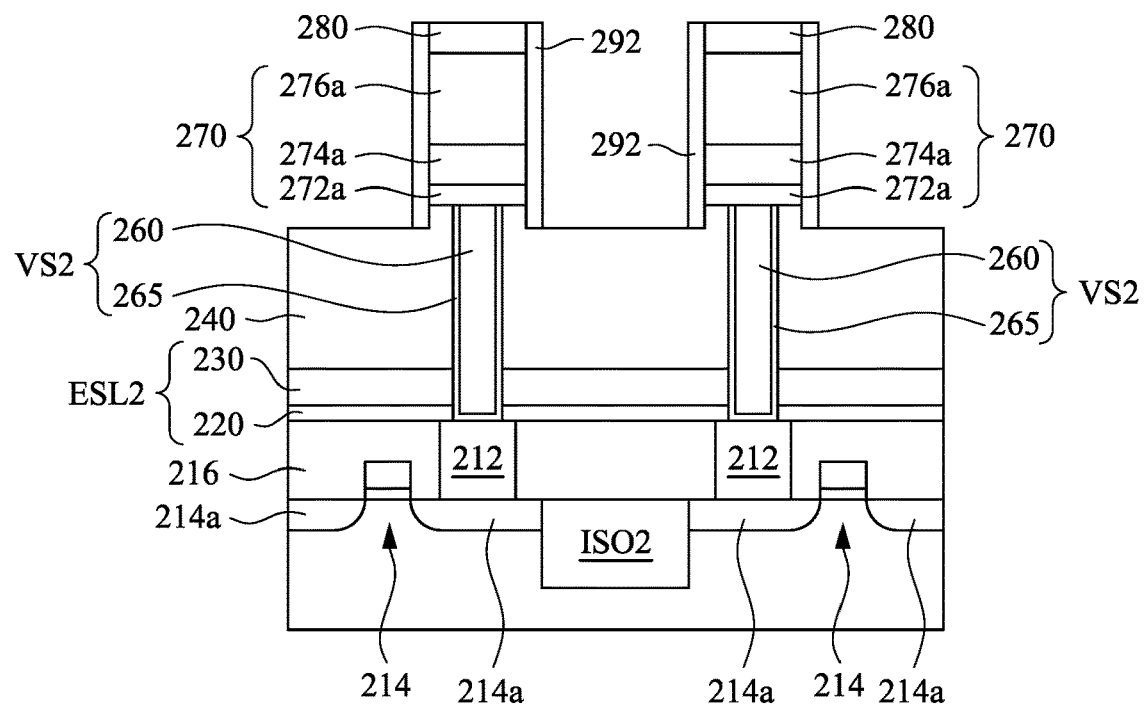
Figure 2O:
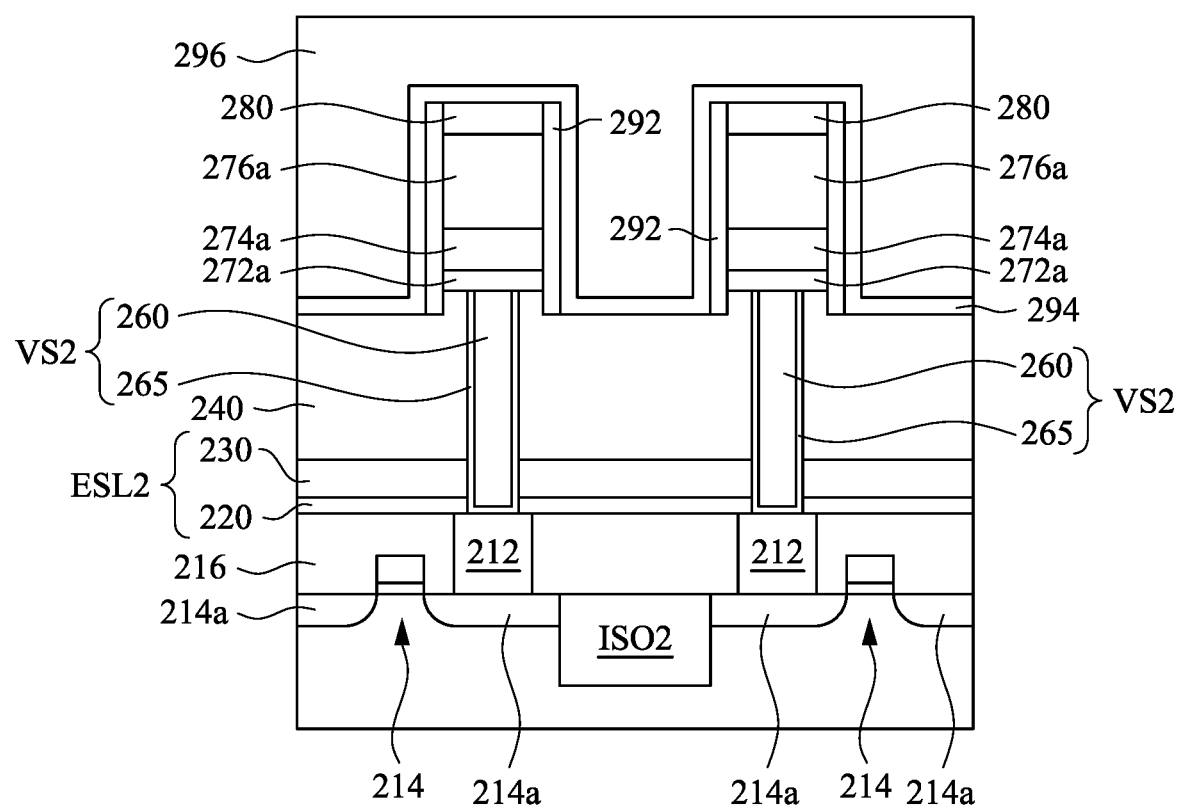
Figure 2P:
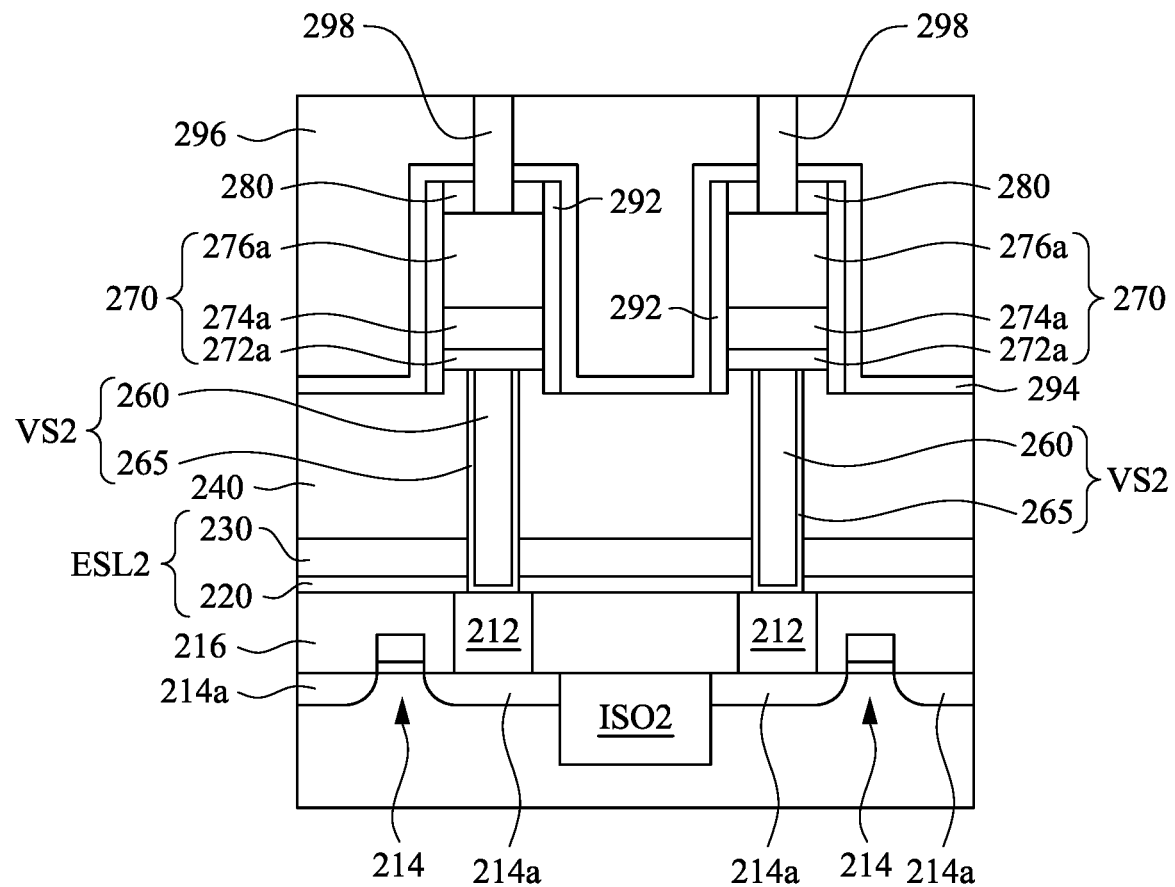

FIGS. 2A to 2P are cross-sectional views of intermediate stages showing a method for fabricating a magnetoresistive random access memory (MRAM) device in accordance with some embodiments of the present disclosure. As shown in FIG. 2A, an isolation structure ISO2 is formed in a semiconductor substrate 211, and transistors 214 are formed on the semiconductor substrate 211. The transistors 214 are separated by the isolation structure ISO2. In some embodiments, the semiconductor substrate 211 may include a semiconductor material and may include a graded layer or a buried oxide, for example. In some embodiments, the semiconductor substrate 211 includes bulk silicon that may be undoped or doped (e.g., p-type, n-type, or a combination thereof). Other materials that are suitable for semiconductor device formation may be used. Other materials, such as germanium, quartz, sapphire, and glass, could alternatively be used for the semiconductor substrate 211. Alternatively, the semiconductor substrate 211 may include an active layer of a semiconductor-on-insulator (SOI) substrate or a multi-layered structure such as a silicon-germanium layer formed on a bulk silicon layer.

A first dielectric layer 216 is formed over the transistors 214. In some embodiments, the first dielectric layer 216 is formed by, for example, chemical vapor deposition (CVD). The first dielectric layer 216 may include any suitable dielectric material including silicon oxide, silicon nitride, silicon oxynitride, hafnium oxide, zirconium oxide, titanium oxide, aluminum oxide, hafnium dioxide-alumina ($H_fO_2$—$Al_2O_3$) alloy, phosphosilicate glass (PSG), borophosphosilicate glass (BPSG), other suitable dielectric materials, and/or combinations thereof. In some embodiments, the first dielectric layer 216 may be formed using a silicon-containing precursor including tetra-ethyl-ortho-silicate (TEOS). The first dielectric layer 216 may include a low-k dielectric material, such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper porous polymeric materials, or combinations thereof.

Contacts 212 are formed in the first dielectric layer 216, thereby providing a semiconductor device 210. In some embodiments, the first dielectric layer 216 is etched to form through holes that respectively realize source/drain regions 214a of the transistors 214. Then, a diffusion barrier layer is conformally formed on sidewalls and bottoms of the thorough holes and a top surface 216s of the first dielectric layer 216, and a conductive layer is formed over the diffusion barrier layer. Excess portions of the diffusion barrier layer and the conductive layer over the top surface 216s of the first dielectric layer 216 are removed to form contacts 212 in the first dielectric layer 216. Removal of the excess portions of the diffusion barrier layer and the conductive layer may be performed using chemical mechanical planarization. After removing the excess portions of the diffusion barrier layer and the conductive layer, the top surface 216s of the first dielectric layer 216 is substantially flat, and top surfaces of the contacts 212 are substantially coplanar with the top surface 216s of the first dielectric layer 216. The contacts 212 respectively land on the source/drain regions 214a of the transistors 214 to provide electrical connections. In some embodiments, the contacts 212 include Co, Cu, W, TiN, Ti, TaN, other suitable materials, or combinations thereof.

Figure 3A:
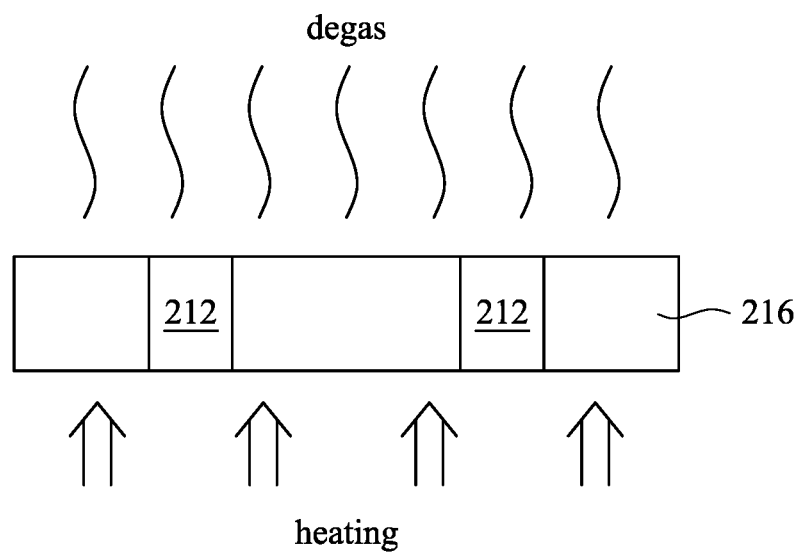
FIG. 3A to FIG. 3E are cross-sectional views of intermediate stages showing a method for fabricating a metal nitride layer in accordance with some embodiments of the present disclosure.
Figure 3B:
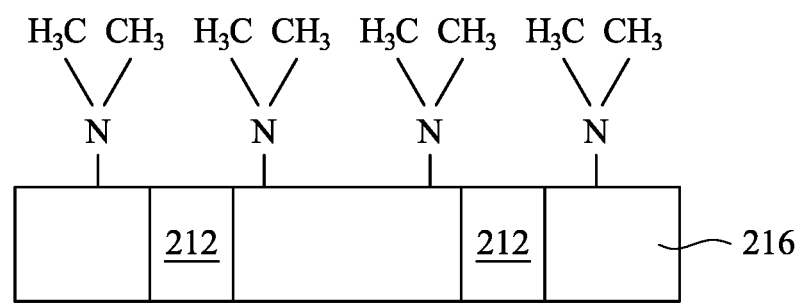
Figure 3C:
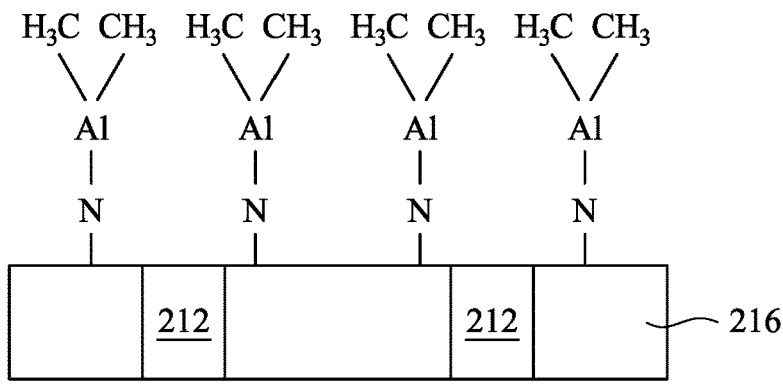
Figure 3D:
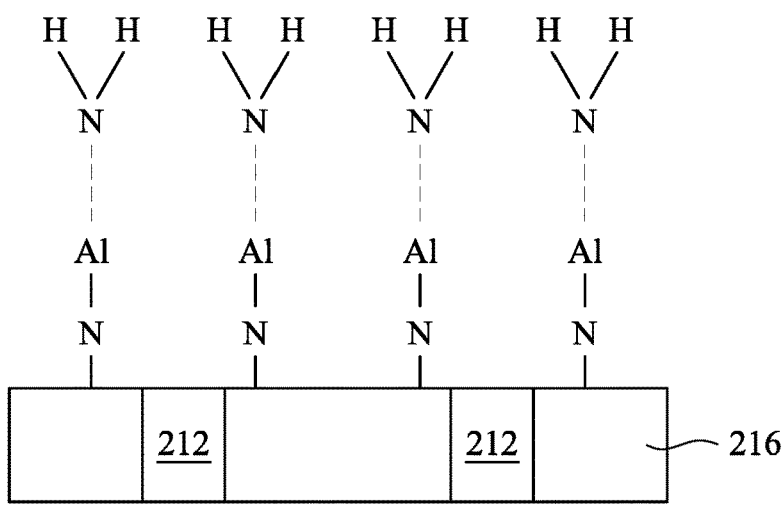

As shown in FIG. 2B, a bottom etch stop layer 220 is formed over the contacts 212 and the first dielectric layer 216. In some embodiments, the bottom etch stop layer 220 include a metal nitride. Formation of the bottom etch stop layer 220 is shown in FIG. 3A to FIG. 3E. As shown in FIG. 3A, a pre-treatment operation is conducted on the contacts 212 and the first dielectric layer 216 to clean the top surfaces of the contacts 212 and the first dielectric layer 216. At the pre-treatment operation, the wafer where the contacts 212 and the first dielectric layer 216 are formed is placed into a chamber and a gas including Ar, H2, O3, N2 or NH3 is induced into the chamber. When the contacts 212 and the first dielectric layer 216 are pretreated by the gas, the contacts 212 and the first dielectric layer 216 are heated to a temperature in a range from about 100° C. to about 500° C., and a time period of heating the contacts 212 and the first dielectric layer 216 is in a range from about 10 seconds to about 30 seconds. Then, a degas operation is conducted in the chamber to exhaust the gas from the chamber. Therefore, particles and/or water adsorbed on a top surface of the wafer, i.e. the top surfaces of the contacts 212 and the first dielectric layer 216, desorb. As shown in FIG. 3B, the wafer is soaked in NH3, thereby providing amine groups on the top surfaces of the contacts 212 and the first dielectric layer 216. As shown in FIG. 3C, the top surfaces of the contacts 212 and the first dielectric layer 216 is exposed to a precursor of Al, thereby providing functional groups of AlN(CH3)2 on the top surfaces of the contacts 212 and the first dielectric layer 216. In some embodiments, the operations shown in FIG. 3B) and FIG. 3C are repeated at a temperature from about 100° C. from about 600° C. and at a pressure from about 0 torr to about 100 torr. In some embodiments, a temperature of the precursor of Al is from about 20° C. to about 100° C. In some embodiments, the precursor of Al is provided by using a gas line, and the gas line pushes the precursor of Al by using a gas of N2. A temperature of the gas line is greater than about 200° C. After repeating operations shown in FIG. 3B and FIG. 3C, functional groups of which the chemical formula is —(NAl)x-NH2 are provided on the top surfaces of the contacts 212 and the first dielectric layer 216, as shown in FIG. 3D. Then, a dehydrogenation operation is conducted to form the bottom etch stop layer 220 that includes AlN on the top surfaces of the contacts 212 and the first dielectric layer 216.

In some embodiments, after the bottom etch stop layer 220 is formed, a post-treatment operation is conducted on the bottom etch stop layer 220 to clean a surface of the bottom etch stop layer 220. In some embodiments, the post-treatment operation is a plasma cleaning process by using gas including Ar, H2, O3, N2 or $NH_3$ at a temperature in a range from about 100° C. from about 700° C.

As shown in FIG. 2C, a top etch stop layer 230 is formed over the bottom etch stop layer 220. In some embodiments, the top etch stop layer 230 include a metal oxide. For example, the top etch stop layer 230 includes an aluminum oxide. The top etch stop layer 230 may be formed using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof. Further, in some embodiments, the bottom etch stop layer 220 can be formed using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof.

In some embodiments, the bottom etch stop layer 220 includes aluminum nitride, and the top etch stop layer 230 includes aluminum oxide. In other embodiments, the bottom etch stop layer 220 includes tantalum nitride, and the top etch stop layer 230 includes tantalum oxide. In yet other embodiments, the bottom etch stop layer 220 includes titanium nitride, and the top etch stop layer 230 includes titanium oxide. However, embodiments of the present disclosure are not limited thereto.

In some embodiments, a thickness 220h of the bottom etch stop layer 220 is greater than or equal to about 5 angstrom and smaller than or equal to about 100 angstrom, and a ratio of a thickness 230h of the top etch stop layer 230 to the thickness 220h of the bottom etch stop layer 220 is about 10 to 1. In other words, a thickness of a etch stop layer ESL2 including the bottom etch stop layer 220 and the top etch stop layer 230 is greater than or equal to about 10 angstrom and smaller than or equal to about 1100 angstrom.

In some embodiments, the bottom etch stop layer 220 is capable of preventing oxide diffusion when hydrogen is introduced. For example, hydrogen may be introduced when forming the top etch stop layer 230, and the bottom etch stop layer 220 is capable of preventing oxide diffusion when forming the top etch stop layer 230.

In some embodiments, the bottom etch stop layer 220 and/or the top etch stop layer 230 can be doped with C, O or Si to improve the performance for stopping etching.

As shown in FIG. 2D, a second dielectric layer 240 is formed over the etch stop layer ESL2. In some embodiments, the second dielectric layer 240 may include any suitable dielectric material including silicon oxide, silicon nitride, silicon oxynitride, hafnium oxide, zirconium oxide, titanium oxide, aluminum oxide, hafnium dioxide-alumina ($H_fO_2$—$Al_2O_3$) alloy, phosphosilicate glass (PSG), borophosphosilicate glass (BPSG), other suitable dielectric materials, and/or combinations thereof. In some embodiments, the second dielectric layer 240 may be formed using a silicon-containing precursor including tetra-ethyl-ortho-silicate (TEOS). The second dielectric layer 240 may include a low-k dielectric material, such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper porous polymeric materials, or combinations thereof. However, embodiments of the present disclosure are not limited thereto. The second dielectric layer 240 may be formed using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof.

As shown in FIG. 2E, an anti-reflection layer 250 is formed on the second dielectric layer 240. The anti-reflection layer 250 is used to reduce the reflection during subsequent lithography patterning. In some embodiments, when a nitride material is used as the anti-reflection layer 250 in the operation of the lithography patterning, the nitride material may interact with a photoresist during the operation of the lithography patterning and lead to residual polymeric contaminants that are referred to as photoresist poisoning. Accordingly, in some embodiments, the anti-reflection layer 250 includes a nitrogen-free anti-reflective coating (NFARC) material.

In some embodiments, the anti-reflection layer 250 is formed using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof. In other embodiments, the anti-reflection layer 250 is formed using a spin-on operation. However, embodiments of the present disclosure are not limited thereto.

As shown in FIG. 2F, the second dielectric layer 240 and the anti-reflection layer 250 are etched using a first etching operation to form through holes V21 passing through the second dielectric layer 240 and the anti-reflection layer 250. In some embodiments, the first etching operation is a partial etching operation conducted using a photoresist. However, embodiments of the present disclosure are not limited thereto. Because the etch stop layer ESL2 is under the second dielectric layer 240, the first etching operation stops at the etch stop layer ESL2, and portions of the etch stop layer ESL2 are exposed by the through holes V21.

As shown in FIG. 2G, the exposed portions of the etch stop layer ESL2 are etched using a second etching operation to form through holes V22 passing through the second dielectric layer 240, the anti-reflection layer 250, and the etch stop layer ESL2. In some embodiments, the second etching operation is a wet etching operation. The second dielectric layer 240 and the anti-reflection layer 250 are influenced by the second etching operation when the second etching operation is conducted. In some embodiments, the second etching operation is conducted at a temperature from about 25° C. to about 100° C. In some embodiments, an etching rate of the etch stop layer ESL2 is from about 10 Å/s to about 100 Å/s in the second etching operation.

When the etch stop layer ESL2 is etched to form the through holes V22, a top portion of the second dielectric layer 240 may be damaged by the second etching operation. If the thickness of the etch stop layer ESL2 is greater than about 1100 angstrom, the time period of the second etching operation may be too long, and damages on the top portion of the second dielectric layer 240 may result in wider top portions of the through holes V22. That will be translated into a smaller distance between the top portions of the through holes V22. The smaller distance between the top portions of the through holes V22 may cause current leakage between the via structures received in the through holes V22. If the thickness of the etch stop layer ESL2 is smaller than about 10 angstrom, the first etching operation may not stop at the etch stop layer ESL2.

As shown in FIG. 2H, a diffusion barrier layer 265 is conformally formed on sidewalls and bottoms of the through holes V22 and a top surface of the anti-reflection layer 250. In some embodiments, the diffusion barrier 265 is formed using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof. In some embodiments, the diffusion barrier 265 includes TiN, TaN, Ta, Ti, Co, Ni, or combinations thereof.

As shown in FIG. 2I, a conductive layer 260 is formed over the diffusion barrier 265. In some embodiments, the conductive layer 260 is formed using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof. In some embodiments, the conductive layer 260 may include Co, Cu, W, TiN, Ti, TaN, other suitable materials, or combinations thereof.

As shown in FIG. 2J, excess portions of the conductive layer 260 and the diffusion barrier layer 265 over a top surface of the second dielectric layer 240 and the anti-reflection layer 250 are removed to form via structures VS2 in the through holes V22. In some embodiments, removal of the excess portions of the conductive layer 260 and the diffusion barrier layer 265 and the anti-reflection layer 250 may be performed using chemical mechanical planarization. After removing the excess portions of the conductive layer 260 and the diffusion barrier layer 265 and the anti-reflection layer 250, the top surface of the second dielectric layer 240 is substantially flat, and top surfaces of the via structures VS2 are substantially coplanar with the top surface of the second dielectric layer 240. However, embodiments of the present disclosure are not limited thereto.

As shown in FIG. 2K, a first electrode layer 272, a storage material layer 274, and a second electrode layer 276 are sequentially formed over the second dielectric layer 240. In some embodiments, the first electrode layer 272 and the second electrode layer 276 are formed using a deposition operation such as chemical vapor deposition (CVD), plasma enhanced chemical vapor deposition (PECVD), atomic layer deposition (ALD) or plasma enhanced atomic layer deposition (PEALD), and the first electrode layer 272 and the second electrode layer 276 may include Ti, Ta, TiN, TaN, or other suitable metals or materials.

In some embodiments, the storage material layer 274 may include multiple layers. For example, the storage material layer 274 may include a magnetic tunnel junction (MTJ) cell having a free synthetic antiferromagnetic (SAF) layer, a pinned SAF layer, and a tunnel barrier layer interposed between the free SAF layer and the pinned SAF layer. Further, the free SAF layer may include a plurality of ferromagnetic layers and at least one antiferromagnetic coupling spacer layers interposed between two adjacent ones of the ferromagnetic layers. The pinned SAF layer may include a pinned ferromagnetic layer, a fixed ferromagnetic layer, and an antiferromagnetic coupling spacer layer interposed between the pinned ferromagnetic layer and the fixed ferromagnetic layer. The material for the tunnel barrier layer may include an electrically insulating material that forms a tunneling junction. Examples of such material include MgO, AlN, TaN, and/or $Ta_2O_5$. In some embodiments, the MTJ cell includes Co, Fe, B, Ni, Mg, Mo, or Ru, or a combination thereof. In some embodiments, the MTJ cell can be manufactured by thin film technologies, such as magnetron sputter deposition, molecular beam epitaxy, pulsed laser deposition, electron beam physical vapor deposition, or any other suitable methods.

As shown in FIG. 2L, mask layers 280 are formed over the second electrode layer 276. In some embodiments, the mask layers 280 are aligned to the via structures VS. In some embodiments, the mask layers 280 are formed using lithography and etching operations and may include silicon nitride or silicon oxynitride.

As shown in FIG. 2M, a patterning operation is conducted on the first electrode layer 272, the storage material layer 274 and the second electrode layer 276 using the mask layers 280 to form memory stacks 270. Each of the memory stacks 270 includes a patterned first electrode layer 272a, a patterned storage material layer 274a and a patterned second electrode layer 276a. In some embodiments, the memory stacks 270 may be formed by any suitable etching techniques such as for example dry plasma etching process and reactive ion etching (RIE) techniques.

As shown in FIG. 2N, spacers 292 are formed on sidewalls of the mask layers 280 and the memory stacks 270. In some embodiments, the spacers 292 are formed by chemical vapor deposition (CVD), plasma enhanced chemical vapor deposition (PECVD), atomic layer deposition (ALD) or plasma enhanced atomic layer deposition (PEALD) and then being etched to define the spacers 292. The spacers 292 may include silicon nitride or silicon carbide.

As shown in FIG. 2O, a dielectric liner layer 294 and a third dielectric layer 296 are sequentially formed over the spacers 292 and the mask layers 280. In some embodiments, the third dielectric layer 296 functions as a planarization layer for subsequent operations.

As shown in FIG. 2P, contacts 298 are formed in the third dielectric layer 296 and pass through the third dielectric layer 296, the dielectric liner layer 294 and the mask layers 280 to provide electrical connections for the patterned second electrode layers 276a of the memory stacks 270. For example, an etching operation is conducted on the third dielectric layer 296, the dielectric liner layer 294 and the mask layers 280 to form through holes passing through the third dielectric layer 296, the dielectric liner layer 294 and the mask layers 280. Then, a diffusion barrier layer is conformally formed on sidewalls and bottoms of the thorough holes and a top surface of the third dielectric layer 296, and a conductive layer is formed over the diffusion barrier layer. Excess portions of the diffusion barrier layer and the conductive layer over the top surface of the third dielectric layer 296 are removed to form contacts 298 in the third dielectric layer 296. Removal of the excess portions of the diffusion barrier layer and the conductive layer may be performed using chemical mechanical planarization. After removing the excess portions of the diffusion barrier layer and the conductive layer, the top surface of the third dielectric layer 296 is substantially flat, and top surfaces of the contacts 212 are substantially coplanar with the top surface of the third dielectric layer 296. The contacts 298 respectively land on the patterned second electrode layers 276a of the memory stacks 270 to provide electrical connections. In some embodiments, the contacts 298 include tungsten, tungsten-based alloy, copper, copper-based alloy, other suitable materials, or combinations thereof.

Figure 4A:
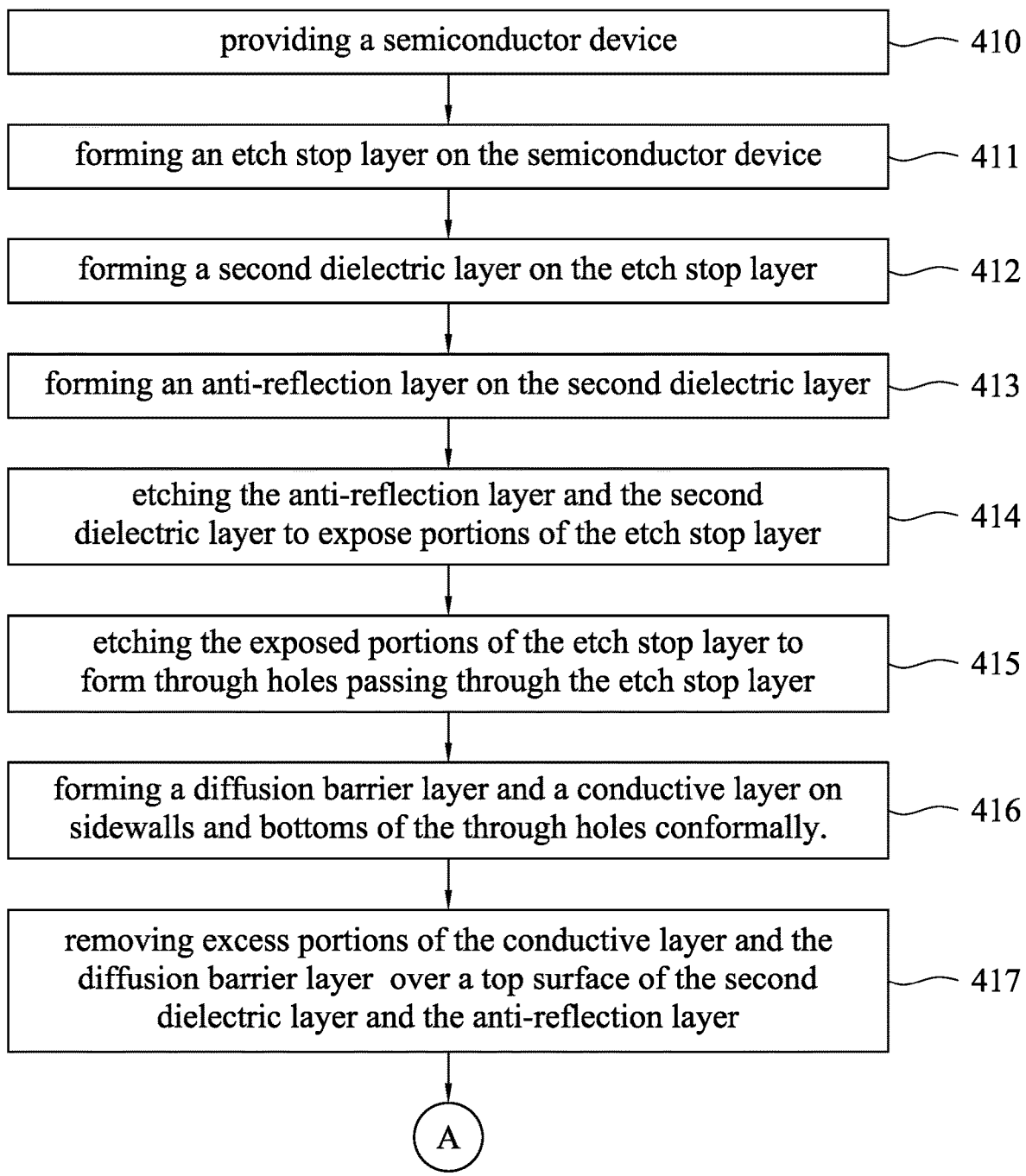
FIG. 4A to FIG. 4B are flow charts showing a method for fabricating a MRAM device in accordance with some embodiments of the present disclosure.
Figure 4B:
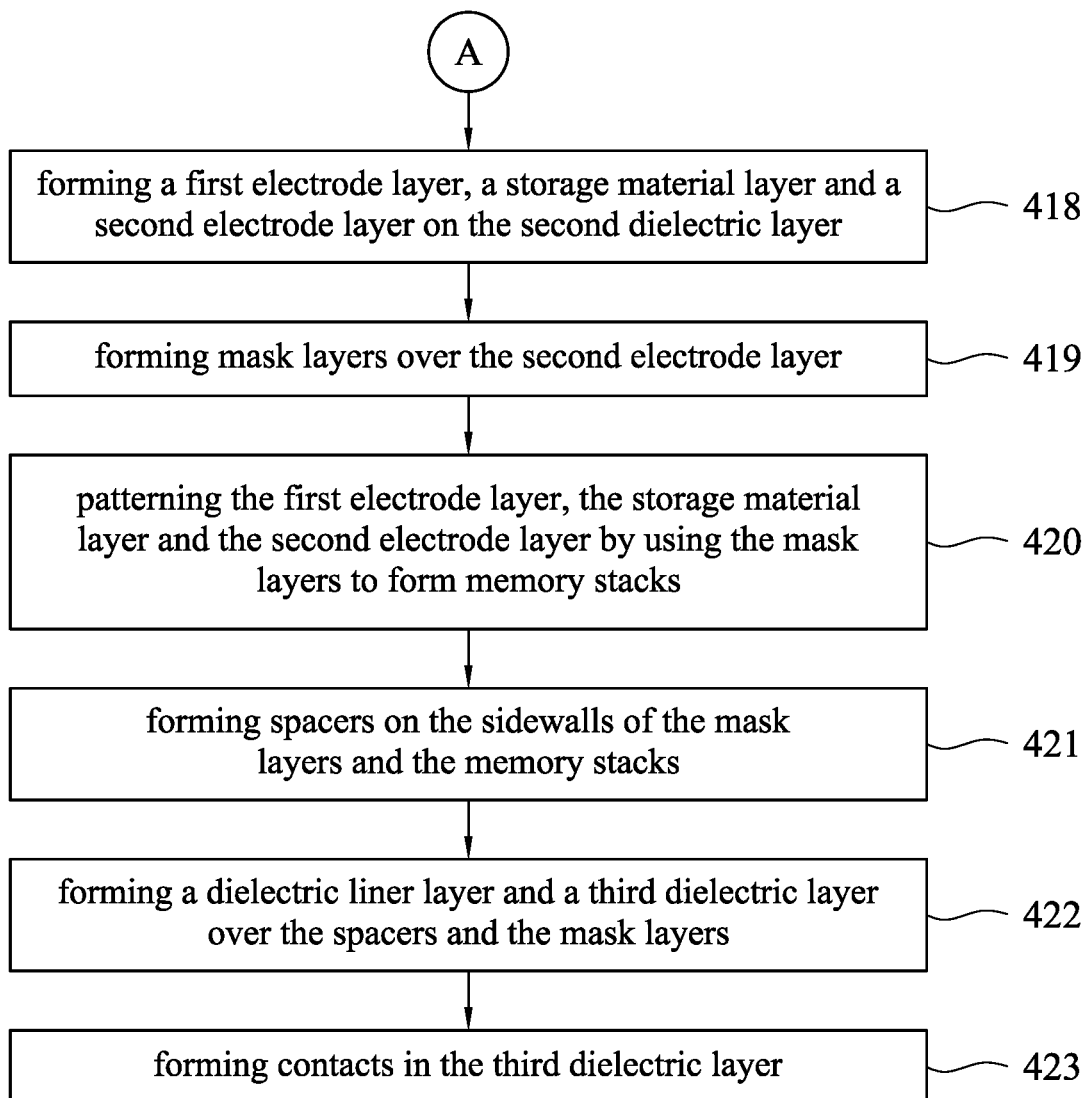
Figure 4C:
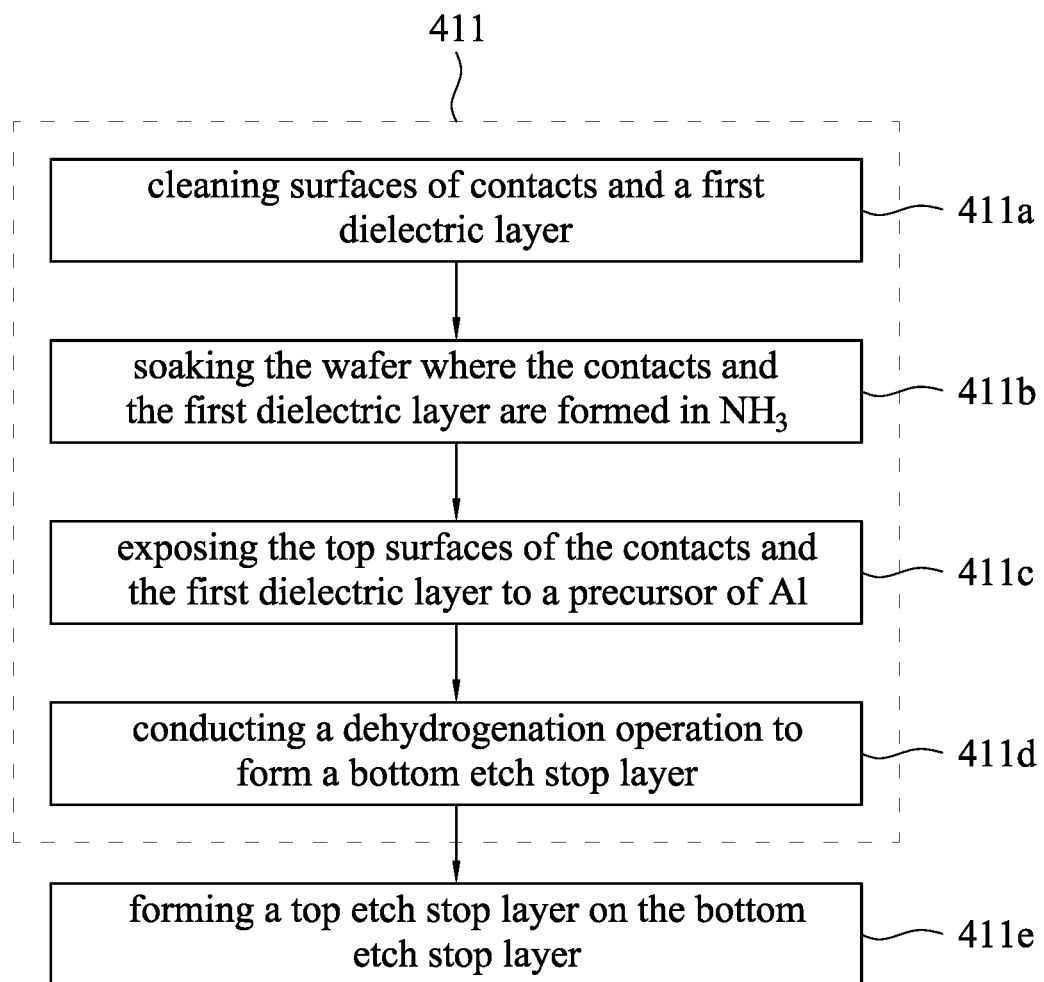
FIG. 4C is a flow chart showing a method for forming an etch stop layer in accordance with some embodiments of the present disclosure.

Referring to FIG. 4A to FIG. 4B, FIG. 4A to FIG. 4B are flow charts of a method 400 for fabricating a MRAM device in accordance with some embodiments of the present disclosure. At operation 410, the semiconductor device 210 having the contacts 212 and the transistors 214 is provided, as shown in FIG. 2A. In the operation 210, the transistors 214 are formed in the substrate 211. Then, the first dielectric layer 216 is deposited over the transistors 214, and the contacts 212 are formed in the dielectric layer 216 and electrically connected to the transistors 214. After operation 410, operation 411 is conducted. At operation 411, the etch stop layer ESL2 is formed on the semiconductor device 210, as shown in FIG. 2C. A flow chart of the operation 411 for forming the etch stop layer ESL2 is shown in FIG. 4C. The operation 411 includes operations 411a-411d for forming the bottom etch stop layer 220 on the semiconductor device 210 as shown in FIG. 2B and operation 411e for forming the top etch stop layer 230 on the bottom etch stop layer 220 as shown in FIG. 2C.

Figure 3E:
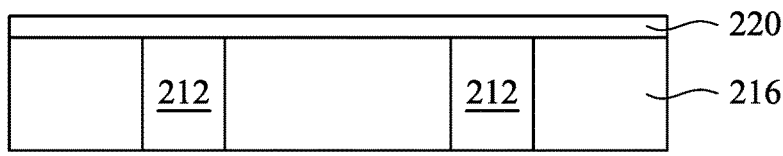

In some embodiments, at operation 411a, the surfaces of the contacts 212 and the first dielectric layer 216 are cleaned, as shown in FIG. 3A. Then, at operation 411b, the wafer where the contacts 212 and the first dielectric layer 216 are formed is soaked in NH$_3$, as shown in FIG. 3B. Thereafter, at operation 411c, the top surfaces of the contacts 212 and the first dielectric layer 216 are exposed to a precursor of Al, as shown in FIG. 3C. In some embodiments, a temperature of the precursor of Al is ranged from 20° C. to 100° C. Then, at operation 411d, the dehydrogenation operation is conducted to form the bottom etch stop layer 220, as shown in FIG. 3E. In some embodiments, before operation 411d, the operation 411b and the operation 411c are repeated to form functional groups of which the chemical formula is —(NAl)x-NH$_2$, as shown in FIG. 3D.

Returning to FIG. 4A and FIG. 4B, after operation 411 for forming the bottom etch stop layer 220, operation 412 is performed. At operation 412, the second dielectric layer 240 is formed on the etch stop layer ESL2, as shown in FIG. 2D. Then, at operation 413, the anti-reflection layer 250 is formed on the second dielectric layer 240, as shown in FIG. 2E. Thereafter, at operation 414, the second dielectric layer 240 and the anti-reflection layer 250 are etched by using the first etching operation to expose portions of the etch stop layer ESL2, as shown in FIG. 2F. Then, at operation 415, the exposed portions of the etch stop layer ESL2 are etched by using the second etching operation to form through holes V22 passing through the etch stop layer ESL2, the second dielectric layer 240 and the anti-reflection layer 250, as shown in FIG. 2G. Thereafter, at operation 416, the diffusion barrier layer 265 and the conductive layer 260 are sequentially formed on the anti-reflection layer 250, as shown in FIG. 2H and FIG. 2I. Then, at operation 417, the excess portions of the conductive layer 260 and the diffusion barrier layer 265 over a top surface of the second dielectric layer 240 and the anti-reflection layer 250 are removed to form the via structures VS2, as shown in FIG. 2J. Thereafter, at operation 418, the first electrode layer 272, the storage material layer 274 and the second electrode layer 276 are sequentially formed on the second dielectric layer 240, as shown in FIG. 2K. Then, at operation 419, the mask layers 280 are formed over the second electrode layer 276, as shown in FIG. 2L. Thereafter, at operation 420, the first electrode layer 272, the storage material layer 274 and the second electrode layer 276 are patterned by using the mask layers 280 to form the memory stacks 270, as shown in FIG. 2M. Then, at operation 421, the spacers 292 are formed on the sidewalls of the mask layers 280 and the memory stacks 270, as shown in FIG. 2N. Thereafter, at operation 422, the dielectric liner layer 294 and the third dielectric layer 296 are sequentially formed on the spacers 292 and the mask layers 280, as shown in FIG. 2O. Then, at operation 423, the contacts 298 are formed in the third dielectric layer 296 and pass through the third dielectric layer 296, the dielectric liner layer 294 and the mask layers 280 to provide electrical connection for the patterned second electrode layers 276a of the memory stacks 270, as shown in FIG. 2P.

Figure 5:
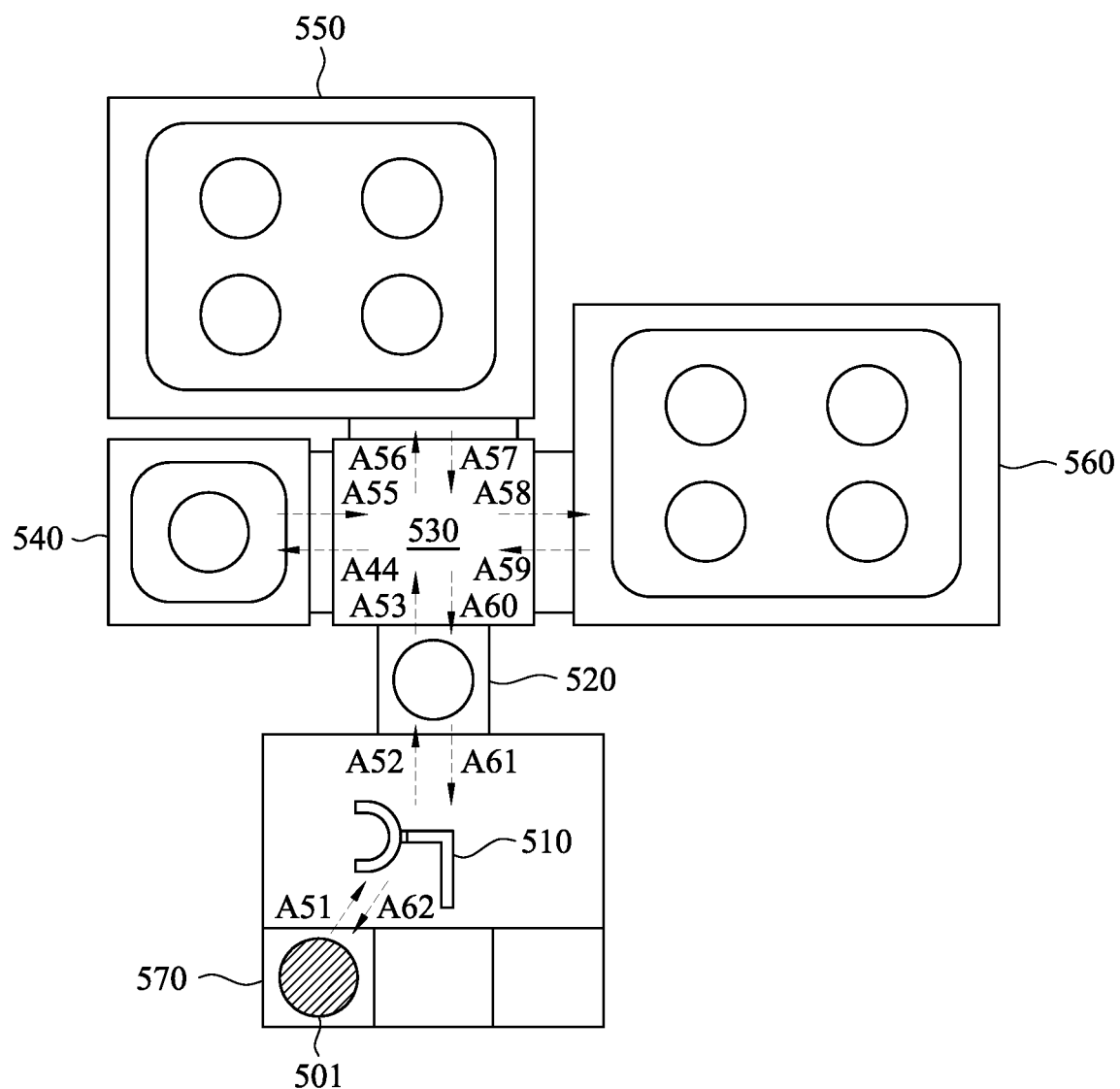
FIG. 5 is a schematic diagram showing equipment for forming the bottom etch stop layer in accordance with some embodiments of the present disclosure.

Referring to FIG. 5, FIG. 5 is a schematic diagram showing an equipment 500 for forming the bottom etch stop layer 220. The equipment 500 includes a robot arm 510, a receiving device 520, a transferring device 530, a pre-treatment device 540, a processing device 550 and a post-treatment device 560. At first, the robot arm 510 picks up a wafer 501 from a region 570 (arrow A51), in which the wafer 501 may be the semiconductor device 210 shown in FIG. 2A. Then, the robot arm 510 places the wafer 501 on the receiving device 520 (arrow A52). Thereafter, the wafer 501 is transmitted to the transferring device 530 from the receiving device 520 (arrow A53). Then, the wafer 501 is transmitted to the pre-treatment device 540 by the transferring device 530 (arrow A54). The pre-treatment device 540 has a chamber for conducting the aforementioned pre-treatment operation as shown in FIG. 3A. After pre-treating the wafer 501, the wafer 501 is transmitted to the transferring device 530 (arrow A55). Then, the wafer 501 is transmitted to the processing device 550 by the transferring device 530 (arrow A56). The processing device 550 has plural chambers for conducting operations for forming the bottom etch stop layer 220, as shown in FIG. 3B to FIG. 3D. Thereafter, the wafer 501 is transmitted to the transferring device 530 from the processing device 550 (arrow A57). Then, the wafer 501 is transmitted to the post-treatment device 560 by the transferring device 530 (arrow A58). The post-treatment device 560 has plural chambers for conducting the aforementioned post-treatment operation. Thereafter, the wafer 501 is transmitted to the transferring device 530 from the post-treatment device 560 (arrow A59). Then, the wafer 501 is transmitted to the receiving device 520 by the transferring device 530 (arrow A60). Thereafter, the robot arm 510 picks up the wafer 501 from the receiving device 520 (arrow A61). Then, the wafer 501 is placed on the region 570 (arrow A62) for being carried to another equipment for subsequent operations.

In the above embodiments, the MRAM device is fabricated by using an etch stop layer. The etch stop layer includes a bottom etch stop layer and a top etch stop layer disposed on the bottom etch stop layer. The bottom etch stop layer is made of a metal-based nitride material, and the top etch stop layer is made of a metal-based oxide material, thereby enabling the etch stop layer to have a smaller thickness. In some embodiments, the thickness of the etch stop layer is smaller than or equal to about 1100 angstrom. Therefore, a time period of an etching operation for removing the etch stop layer is decreased because of the smaller thickness of the etch stop layer, and damages caused on a dielectric layer located on the etch stop layer can be prevented accordingly.

In accordance with an embodiment of the present disclosure, the present disclosure discloses a device including a transistor, a first dielectric layer, a contact, a bottom etch stop layer, a top etch stop layer, a second dielectric layer, a memory stack and a via structure. The first dielectric layer is disposed over the transistor. The contact is disposed in the first dielectric layer and electrically connected to the transistor. The bottom etch stop layer is disposed over the first dielectric layer, in which the bottom etch stop layer comprises a metal nitride. The top etch stop layer is disposed over the bottom etch stop layer. The second dielectric layer is disposed over the top etch stop layer. The memory stack is disposed over the second dielectric layer. The via structure is disposed in the second dielectric layer, the top etch stop layer, and the bottom etch stop layer and electrically connecting the memory stack and the contact.

In some embodiments, the top etch stop layer includes a metal oxide.

In some embodiments, a thickness of the bottom etch stop layer is smaller than or equal to a thickness of the top etch stop layer.

In some embodiments, the top etch stop layer and the bottom etch stop layer includes the same metal.

In some embodiments, the via structure includes a conductor and a barrier layer. The conductor is disposed in the second dielectric layer, and the barrier layer wraps around the conductor.

In some embodiments, the barrier layer is in contact with the top etch stop layer.

In some embodiments, the barrier layer is in contact with the bottom etch stop layer.

In some embodiments, a thickness of a combination of the top etch stop layer and the bottom etch stop layer is greater than or equal to about 10 angstrom and smaller than or equal to about 1100 angstrom.

In some embodiments, the memory stack includes a first electrode layer, a second electrode layer and a storage material layer between the first electrode layer and the second electrode layer.

In accordance with an embodiment of the present disclosure, the present disclosure discloses a device including a transistor, a first dielectric layer, a contact, a bottom etch stop layer, a top etch stop layer, a second dielectric layer, a memory stack and a via structure. The first dielectric layer is disposed over the transistor. The contact is disposed in the first dielectric layer and electrically connected to the transistor. The bottom etch stop layer is disposed over the first dielectric layer. The top etch stop layer is disposed over the bottom etch stop layer, in which a thickness of the bottom etch stop layer is equal to or smaller than a thickness of the top etch stop layer. The second dielectric layer is disposed over the top etch stop layer. The memory stack is disposed over the second dielectric layer. The via structure is disposed in the second dielectric layer, the top etch stop layer, and the bottom etch stop layer and electrically connecting the memory stack and the contact.

In some embodiments, a thickness of a combination of the top etch stop layer and the bottom etch stop layer is greater than or equal to about 10 angstrom and smaller than or equal to about 1100 angstrom.

In some embodiments, the memory stack is aligned with the via structure.

In some embodiments, the contact lands on a source/drain region of the transistor.

In accordance with another embodiment of the present disclosure, the present disclosure provides a method for fabricating a semiconductor device. In the method, at first, a first dielectric layer is deposited over a transistor. Then, a contact is formed in the first dielectric layer and electrically connected to the transistor. Thereafter, a metal nitride layer is deposited over the first dielectric layer and the contact. Then, an etch stop layer is deposited over the metal nitride layer. Thereafter, a second dielectric layer is deposited over the etch stop layer. Then, a via structure is formed in the second dielectric layer, the etch stop layer, and the metal nitride layer and landing on the contact. Thereafter, a memory stack is formed over the via structure.

In some embodiments, in the operation for forming the via structure, the second dielectric layer is etched to form a first through hole, in which etching the second dielectric layer stops at the etch stop layer. Then, the etch stop layer and the metal nitride layer are etched to form a second through hole to expose the contact. Thereafter, a conductor is formed in the second through hole.

In some embodiments, etching the etch stop layer and the metal nitride layer includes a wet etching operation.

In some embodiments, depositing the metal nitride layer and depositing the etch stop layer are performed such that a thickness of the metal nitride layer is smaller than or equal to a thickness of the etch stop layer.

In some embodiments, in the operation for depositing the metal nitride layer, top surfaces of the first dielectric layer and the contact are soaked in NH$_3$. Then, top surfaces of the first dielectric layer and the contact are treated with a precursor including Al. Thereafter, a dehydrogenation operation is conducted to form the metal nitride layer over the top surfaces of the first dielectric layer and the contact.

In some embodiments, the metal nitride layer and the etch stop layer are deposited such that a thickness of a combination of the metal nitride layer and the etch stop layer is greater than or equal to about 10 angstrom and smaller than or equal to about 1100 angstrom.

In some embodiments, the method further includes depositing an anti-reflection layer over the second dielectric layer prior to forming the via structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a first dielectric layer over a transistor;
   forming a contact in the first dielectric layer and electrically connected to the transistor;
   depositing a metal nitride layer over the first dielectric layer and the contact;
   depositing an etch stop layer over the metal nitride layer, wherein a thickness of the metal nitride layer is smaller than or equal to a thickness of the etch stop layer;
   depositing a second dielectric layer over the etch stop layer;
   forming a via structure in the second dielectric layer, the etch stop layer, and the metal nitride layer and landing on the contact; and
   forming a memory stack over the via structure.

2. The method of claim 1, wherein forming the via structure comprises:
   etching the second dielectric layer to form a first through hole, wherein etching the second dielectric layer stops at the etch stop layer;
   etching the etch stop layer and the metal nitride layer to form a second through hole to expose the contact; and
   forming a conductor in the second through hole.

3. The method of claim 2, wherein etching the etch stop layer and the metal nitride layer comprises a wet etching operation.

4. The method of claim 1, wherein depositing the metal nitride layer comprises:
   soaking top surfaces of the first dielectric layer and the contact in NH3;
   treating top surfaces of the first dielectric layer and the contact with a precursor comprising Al; and
   conducting a dehydrogenation operation to form the metal nitride layer over the top surfaces of the first dielectric layer and the contact.

5. The method of claim 1, wherein depositing the metal nitride layer and depositing the etch stop layer are performed such that a thickness of a combination of the metal nitride layer and the etch stop layer is greater than or equal to about 10 angstrom and smaller than or equal to about 1100 angstrom.

6. The method of claim 1, further comprising:
depositing an anti-reflection layer over the second dielectric layer prior to forming the via structure.

7. The method of claim 1, wherein depositing the metal nitride layer over the first dielectric layer and the contact comprises:
forming a plurality of amine groups on the contact and the first dielectric layer; and
replacing a plurality of hydrogen atoms in the amine groups with a metal containing precursor to form the etch stop layer.

8. A method, comprising:
forming a contact in a first dielectric layer;
forming a plurality of amine groups on the contact and the first dielectric layer;
replacing a plurality of hydrogen atoms in the amine groups with a metal containing precursor to form an etch stop layer over the contact and the first dielectric layer;
etching a portion of the etch stop layer to form a through hole; and
filling the through hole with a conductive material landing on the contact.

9. The method of claim 8, wherein forming the amine groups on the contact and the first dielectric layer is performed by soaking the contact and the first dielectric layer in NH3.

10. The method of claim 8, wherein replacing the hydrogen atoms in the amine groups with the metal containing precursor is performed by introducing a metal containing gas to the contact and the first dielectric layer.

11. The method of claim 8, wherein the metal containing precursor comprises $AlN(CH_3)_2$ that is of gas and used as a source of the etch stop layer.

12. The method of claim 8, wherein the etch stop layer comprising metal nitride.

13. The method of claim 8, further comprising:
after replacing the hydrogen atoms in the amine groups, introducing amine groups to the contact and the first dielectric layer.

14. The method of claim 8, further comprising:
forming a metal oxide layer over the etch stop layer prior to etching the portion of the etch stop layer.

15. The method of claim 14, wherein the metal oxide layer comprises a metal substantially the same as a metal of the etch stop layer.

16. A method, comprising:
forming a contact in a first dielectric layer;
soaking the contact and the first dielectric layer in ammonia;
introducing a metal containing precursor to the contact and the first dielectric layer to form a metal nitride layer, wherein an atomic percentage content of the metal in the metal nitride layer is greater than that of a nitride in the metal nitride layer;
etching a portion of the metal nitride layer to form a through hole; and
filling the through hole with a conductive material landing on the contact.

17. The method of claim 16, wherein soaking the contact and the first dielectric layer in the ammonia is performed such that a plurality of amine groups are formed on a top surface of the contact and a top surface of the first dielectric layer.

18. The method of claim 16, wherein etching the portion of the metal nitride layer is performed by a wet etching process.

19. The method of claim 16, wherein the metal nitride layer comprises aluminum nitride, tantalum nitride, titanium nitride, or combinations thereof.

20. The method of claim 16, wherein the metal containing precursor comprises $AlN(CH_3)_2$ that is of gas and used as a source of the etch stop layer.

* * * * *